US 6,699,796 B2
Mar. 2, 2004

(12) United States Patent
Su

(10) Patent No.: US 6,699,796 B2
(45) Date of Patent: Mar. 2, 2004

(54) SINGLE CHIP PAD OXIDE LAYER GROWTH PROCESS

(75) Inventor: Chin-Ta Su, Yunlin (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/170,449

(22) Filed: Jun. 14, 2002

(65) Prior Publication Data
US 2003/0232508 A1 Dec. 18, 2003

(51) Int. Cl.[7] ............................................. H01L 21/469
(52) U.S. Cl. ..................... 438/769; 438/770; 438/773; 438/775; 438/777; 118/723
(58) Field of Search .................................. 438/769–777

(56) References Cited

U.S. PATENT DOCUMENTS 6,410,456 B1 * 6/2002 Gronet et al. .......... 427/255.37
6,450,116 B1 * 9/2002 Noble et al. ............... 118/50.1

* cited by examiner

Primary Examiner—Dung A Le

(57) ABSTRACT

A single chip pad oxide layer growth process is disclosed. First, a silicon chip is sent into a reaction chamber, which is filled with hydrogen and oxygen. A rapid thermal process is employed to increase the temperature inside the chamber to about 850° C. to 1100° C. to grow a $SiO_2$ layer. The error on the final temperature after the rapid thermal process can be controlled to fluctuate within one to two degrees.

15 Claims, 1 Drawing Sheet

SINGLE CHIP PAD OXIDE LAYER GROWTH PROCESS

BACKGROUND OF THE INVENTION

1. Field of Invention

The invention relates to a semiconductor process and, in particular, to a single chip pad oxide layer process.

2. Related Art

After exposing a silicon chip in a high-temperature and oxygen environment for a period, we can grow a layer of insulator $SiO_2$ with good adhesive and satisfactory electricity properties on the surface of the silicon chip. $SiO_2$ has a wide application in silicon dominated semiconductor elements. Aside from manufacturing by thermally oxidizing silicon chips, we can also achieve the same effect by the CVD (Chemical Vapor Deposition) technology. Such methods include low pressure CVD and plasma CVD.

Which method is used to prepare the $SiO_2$ layer has a great influence on the manufacturing process of the elements. Basically, the $SiO_2$ grown using the thermal oxidation method has the best electricity and material properties among the above-mentioned three methods. However, the temperature needed in this method is usually the highest.

During the earlier semiconductor process, the high-temperature environment does not affect the preparation of elements. Therefore, we often use the simple thermal oxidation method to grow on the silicon chip surface $SiO_2$, such as a pad oxide layer, that is needed for later processes.

Most of the pad oxide layer process is performed using furnaces because it is a high-temperature process and the high-temperature process is often done in furnaces. It is worth mentioning that other heating technologies are neither mature nor stable as the furnace. This is one of the major reasons why the furnace is used. Explicitly speaking, if the temperature cannot be accurately controlled when it is increased from the room temperature to an extremely high temperature (e.g. 800° C.~900° C.), the silicon chip thus prepared may be different in the thickness of the thermal oxide layer. The homogeneity in thickness will be unsatisfactory.

The furnace usually increases the temperature by two to three degrees every minute. Although the furnace process normally prepares one to two hundred silicon chips at a time, it takes quite a long time (about five to six hours).

SUMMARY OF THE INVENTION

One objective of the invention is to shorten the reaction time in the pad oxide layer process.

Another objective of the invention is to increase the homogeneity of the pad oxide layer thickness.

To achieve the above-mentioned and other objectives, the invention provides a single chip pad oxide layer growth process. First, a silicon chip is sent into a reaction chamber, which is filled with hydrogen and oxygen. A rapid thermal process is employed to increase the temperature inside the chamber to about 850° C. to 1100° C. to grow a pad oxide layer. The error on the final temperature after the rapid thermal process can be controlled to fluctuate within one to two degrees.

According to a preferred embodiment of the invention, the ratio of hydrogen to the sum of hydrogen and oxygen is about 5% to 15%. In addition, the pressure inside the reaction chamber can be 5 Torrs to 15 Torrs. The thickness of the a pad oxide layer is about 40 Å to 200 Å.

From one point of view, the invention provides an early semiconductor process which does not use a furnace. First, a silicon chip is sent into a reaction chamber, which is filled with hydrogen and oxygen. A rapid thermal process is employed to increase the temperature inside the chamber to about 850° C. to 1100° C. to grow a pad oxide layer. In comparison with the prior art, the disclosed process has a shorter reaction time and the pad oxide layer thus prepared has better homogeneity in thickness.

From another point of view, the invention provides an early process for semiconductor manufacturing. First, four silicon chips are sent into four reaction chambers that are filled with hydrogen and oxygen. A rapid thermal process is employed to increase the temperature inside the chamber to about 850° C. to 1100° C. to grow a pad oxide layer. The error on the final temperature after the rapid thermal process can be controlled to fluctuate within one to two degrees.

According to a preferred embodiment of the invention, the ratio of hydrogen to the sum of hydrogen and oxygen is about 5% to 15%. In addition, the pressure inside the reaction chamber can be 5 Torrs to 15 Torrs. The thickness of the a pad oxide layer is about 40 Å to 200 Å.

Since it only takes about two to three minutes of reaction time for each chip and four chips can be prepared at a time, the invention only needs a shorter processing time and the $SiO_2$ layer thus fabricated has better homogeneity in thickness.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

Figure 1:
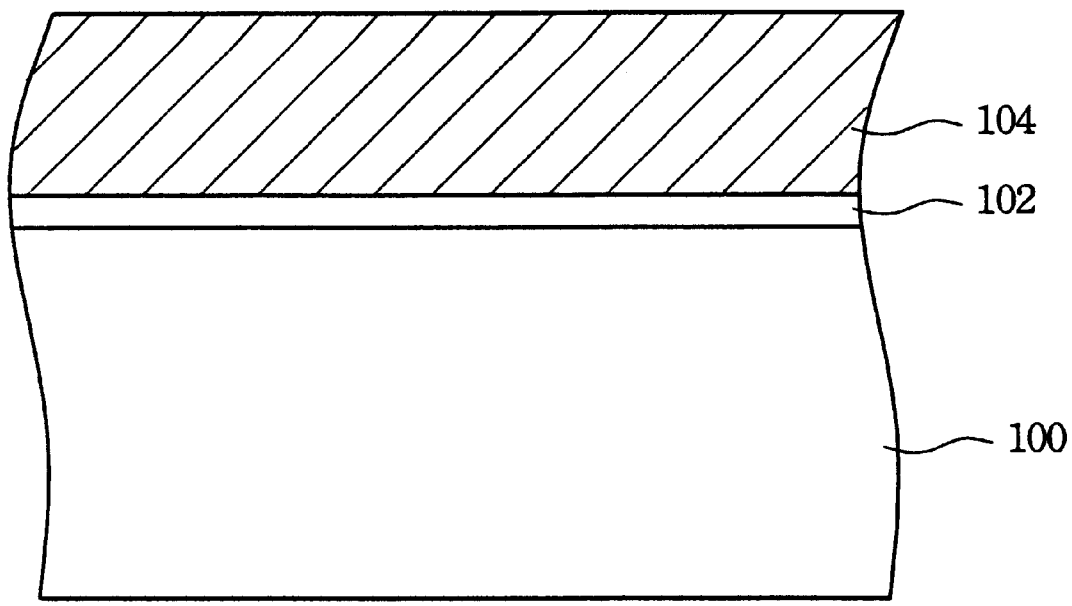
FIG. 1 is a schematic view of a semiconductor element prepared by the early process according to the preferred embodiment of the invention.

With reference to FIG. 1, a new silicon chip 100 is first prepared with appropriate cleaning and then sent into a reaction chamber. The reaction chamber is provided with hydrogen ($H_2$) and oxygen ($O_2$) gas. A thermal oxide layer is grown in a single chip fashion. For example, the pad oxide layer 102 thus prepared has a thickness between 40 Å and 70 Å for thin ones and between 100 Å to 200 Å for thick ones. The manufacturing conditions are, for example:

1. $H_2/(H_2+O_2)$ range: 5~33%;
2. Pressure: 5~15 Torrs;
3. Temperature: 850° C.~1100° C.

The so-called single chip fashion refers to sending a silicon chip into a single reaction chamber for reaction. It takes only two to three minutes for the chip to get out of the chamber, greatly shortening the processing time. An RTP (Rapid Thermal Process) is performed in the chamber. It should be mentioned that the processing for the pad oxide layer 102 belongs to an early process in semiconductor fabrication, which does not have the worry of having a too high temperature or heating for too long. This is because no metal or elements are on the silicon chip 100 at this point.

It should be noted that a reaction machine is usually equipped with several single reaction chambers (usually four), therefore four chips can be prepared at the same time. With this speed, 70–80 wafers can be finished in each hour and about 400 wafers can be done in 5 to 6 hours. It increases the yield by a factor of two at least.

Furthermore, the furnace process in the prior art has a higher risk in accidents. All chips in the furnace will be useless if there is a power failure. In comparison, the invention at most loses four chips and all other unprocessed chips can be saved.

In addition, one advantage of using the RTP is that it can be applied to development processes without reducing the yield. More explicitly, researching and developing new processes often try some very different reaction conditions from conventional ones for the products. If one still uses a furnace to do experiments for a few trial chips, the yield will be greatly affected because it cannot produce chips for products at the same time. Contrary to the furnace, the disclosed RTP reaction chamber does not have such a big impact on the yield.

With further reference to FIG. 1, a silicon nitride layer 104 with a thickness between 700 Å and 2000 Å is formed on the pad oxide layer by CVD (Chemical Vapor Deposition). The adhesion between the silicon nitride layer 104 and the silicon is not perfect; there often has the problem of unwanted stress. Therefore, a pad oxide layer 102 consisted of $SiO_2$ is often inserted between the silicon nitride layer 104 and the silicon before the silicon nitride layer 104 is made.

It is worth noting that the current RTP technology is fairly mature. It takes only a few seconds to increase (one hundred degrees per second) from the room temperature to a high temperature (800° C.–900° C.). The final temperature can be controlled to a high precision (±1° C.~2° C.).

In comparison with the prior art, the reaction time of the disclosed process is shorter and the homogeneity of the fabricated pad oxide layer is better.

While the invention has been described by way of example and in terms of the preferred embodiment, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A single chip pad oxide layer growth process, which comprises the steps of:
    sending a silicon chip to a reaction chamber and supplying the reaction chamber with hydrogen and oxygen; and
    increasing the temperature inside the reaction chamber to the range between 850° C. and 1100° C. using the RTP (Rapid Thermal Process) so that a pad oxide layer having a thickness between 40 Å and 70 Å is grown on the silicon chip;
    wherein the final temperature inside the reaction chamber is controlled to have an error within 2° C.

2. The single chip pad oxide layer growth process of claim 1, wherein the thickness of the pad oxide layer is between 100 Å and 200 Å.

3. An early semiconductor process, which comprises the steps of:
    sending a silicon chip to a reaction chamber and supplying the reaction chamber with hydrogen and oxygen;
    increasing the temperature inside the reaction chamber to the range between 850° C. and 1100° C. using the RTP (Rapid Thermal Process) so that a pad oxide layer is grown on the silicon chip; and
    forming a silicon nitride layer having a thickness between 700–2000 Å on the pad oxide layer.

4. The early semiconductor process of claim 3, wherein the ratio of the hydrogen to the sum of the hydrogen and the oxygen has a range between 5% and 15%.

5. The early semiconductor process of claim 3, wherein the pressure inside the reaction chamber has a range between 5 Torrs and 15 Torrs.

6. The early semiconductor process of claim 3, wherein the thickness of the pad oxide layer is between 40 Å and 70 Å.

7. The early semiconductor process of claim 3, wherein the thickness of the pad oxide layer is between 100 Å and 200 Å.

8. A single chip pad oxide layer growth process, which comprises the steps of:
    sending four silicon chips to four reaction chambers, respectively, and supplying each of the reaction chambers with hydrogen and oxygen; and
    increasing the temperature inside each of the reaction chambers to the range between 850° C. and 1100° C. using the RTP (Rapid Thermal Process) so that a pad oxide layer having a thickness between 40 Å and 70 Å is grown on each of the silicon chips;
    wherein the final temperature inside each of the reaction chambers is controlled to have an error within 2° C.

9. The single chip pad oxide layer growth process of claim 8, wherein the thickness of the pad oxide layer is between 100 Å and 200 Å.

10. An early semiconductor process, which does not use a furnace and comprises the steps of:
    sending four silicon chips to four reaction chambers, respectively, and supplying each of the reaction chambers with hydrogen and oxygen;
    increasing the temperature inside each of the reaction chambers to the range between 850° C. and 1100° C. using the RTP (Rapid Thermal Process) so that a pad oxide layer is grown on each of the silicon chips; and
    forming a silicon nitride layer having a thickness of 700–2000 Å on each of the pad oxide layers.

11. The early semiconductor process of claim 10, wherein the ratio of the hydrogen to the sum of the hydrogen and the oxygen has a range between 5% and 15%.

12. The early semiconductor process of claim 10, wherein the pressure inside the reaction chamber has a range between 5 Torrs and 15 Torrs.

13. The early semiconductor process of claim 10, wherein the thickness of the pad oxide layer is between 40 Å and 70 Å.

14. The early semiconductor process of claim 10, wherein the thickness of the pad oxide layer is between 100 Å and 200 Å.

15. The early semiconductor process of claim 10, wherein it takes two to three minutes to grow the pad oxide layer.

* * * * *